(12) United States Patent
Derix et al.

(10) Patent No.: US 10,734,364 B2
(45) Date of Patent: Aug. 4, 2020

(54) ALIGNED ARRANGEMENT OF LEDS

(71) Applicant: Lumileds LLC, San Jose, CA (US)

(72) Inventors: Robert Derix, Heinsberg (DE); Benno Spinger, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/472,195

(22) PCT Filed: Dec. 12, 2017

(86) PCT No.: PCT/EP2017/082381
§ 371 (c)(1),
(2) Date: Jun. 20, 2019

(87) PCT Pub. No.: WO2018/114470
PCT Pub. Date: Jun. 28, 2018

(65) Prior Publication Data
US 2020/0091119 A1    Mar. 19, 2020

(30) Foreign Application Priority Data
Dec. 21, 2016 (EP) ..................................... 16205802

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/505* (2013.01); *H01L 33/62* (2013.01); *F21S 41/153* (2018.01); *H01L 2933/0066* (2013.01)

(58) Field of Classification Search
CPC ... H01L 25/0753; H01L 33/505; H01L 33/62; H01L 2933/0066; F21S 41/153
See application file for complete search history.

(56) References Cited

U.S. PATENT DOCUMENTS 8,198,713 B2* 6/2012 Hufgard ............. H01L 25/0657
257/678
2009/0008666 A1* 1/2009 Otsuka .................. H01L 33/505
257/98
(Continued)

FOREIGN PATENT DOCUMENTS

EP    1930947 A1    6/2008
EP    2677232 A1    12/2013
(Continued)

*Primary Examiner* — Dale E Page
*Assistant Examiner* — Quovaunda Jefferson
(74) *Attorney, Agent, or Firm* — Volpe and Koenig, P.C.

(57) ABSTRACT

A lighting arrangement includes at least a first and a second LED lighting element arranged next to each other on a carrier surface. The spacer element has, at least in a portion thereof which is in contact with the second LED lighting element, a width which is less than 20% of a width of the first LED lighting element. The first LED lighting element comprises a spacer element projecting into a direction in parallel to the carrier surface. The second LED lighting element is arranged in contact with the spacer element such that it is arranged aligned relative to the first LED lighting element, and such that the first and second LED lighting elements are arranged at a distance forming a gap between the first and second LED lighting elements.

14 Claims, 2 Drawing Sheets

(51) Int. Cl.
*H01L 33/62* (2010.01)
*F21S 41/153* (2018.01)

(56) References Cited

U.S. PATENT DOCUMENTS

2009/0237936 A1    9/2009    Ku
2012/0056221 A1    3/2012    Kim
2012/0074446 A1    3/2012    Choi
2014/0078763 A1    3/2014    Park et al.

FOREIGN PATENT DOCUMENTS

| EP | 2711994 A2 | 3/2014 |
| EP | 2908355 A1 | 8/2015 |
| JP | 2009176899 A | 8/2009 |
| WO | 2006138465 A2 | 12/2006 |
| WO | 2009143802 A1 | 12/2009 |
| WO | 2014173376 A1 | 10/2014 |

\* cited by examiner ent of multiple LEDs.

ALIGNED ARRANGEMENT OF LEDS

FIELD OF THE INVENTION

The invention relates to a lighting arrangement and a method of manufacturing a lighting arrangement. Most specifically, the invention relates to lighting arrangements and manufacturing methods for multiple LED lighting elements arranged next to each other on a carrier surface.

BACKGROUND OF THE INVENTION

Some lighting applications require multiple LEDs in a defined arrangement relative to each other. In particular, it may be desirable to arrange LEDs adjacent to each other in a line or matrix arrangement with a defined distance.

In automotive front lighting a plurality of LEDs may be arranged adjacent to each other to obtain a light source with a desired shape and a high luminous flux. Also, ADB (adaptive driving beam) function may be fulfilled by a matrix arrangement of LEDs, allowing to selectively turn portions of the emitted illumination beam on or off.

EP 2 677 232 A1 describes a light emitting module and a lighting device for a vehicle. The module is provided with semiconductor light-emitting elements mounted on a substrate and arranged in a matrix. A fluorescent substance may be provided as a plate-like member. Light shielding portions are provided to surround the perimeter of respective light-emitting surfaces of the semiconductor light-emitting elements to prevent light leakage.

WO 2009/143802 A1 discloses semiconductor components arranged alongside one another. Each component emits an electromagnetic primary radiation during operation and comprises a wavelength conversion element with a radiation entrance area, a radiation exit area and side areas connecting the radiation entrance area and radiation exit area. A non-transparent material is arranged on the side areas.

Light emitting diodes with a reflective electrode and a side electrode are disclosed in WO 2006/138465 A2. The light emitting diodes include a first doped semiconductor layer, an active region, and a second doped semiconductor layer. A reflective electrode is connected to the edge surfaces of the first doped semiconductor layer. A second reflective electrode includes an optically transparent layer and is connected to the second doped semiconductor layer.

EP 1 930 947 A1 describes a backlight assembly including a plurality of blocks each including a plurality of light emitting diodes. Sides of adjacent blocks are fitted to each other.

JP 2009176899 describes a light source. A body with a light emitting surface has an almost quadrangular-plate shape. Protruding parts and recessed parts in side faces are provided with input and output terminals to electrically connect the light-emitting body elements. The recessed part and protruding parts are fittable to each other.

US 2009/0237936 discloses an LED unit including a plurality of LEDs, each of which includes a base, an LED die mounted on the base and a ring shaped element surrounding the base and the LED. The ring shaped element of the LED is provided with tabs.

SUMMARY OF THE INVENTION

It may be considered an object to provide a lighting arrangement, a vehicle headlight, and a manufacturing method allowing to easily achieve a desired relative arrangement of multiple LEDs.

This is addressed by the lighting arrangement according to claim 1, the vehicle headlight according to claim 14 and the method according to claim 15. Dependent claims refer to preferred embodiments of the invention.

According to the invention, at least a first and a second LED lighting element are arranged next to each other on a carrier surface. As the skilled person will understand, arrangement of only two LED lighting elements is used here to demonstrate the general concept of the invention, while in practice it is preferred to arrange more than two LED lighting elements, such as e.g. three, four or more on the carrier surface. As will be further explained below, different arrangements of two or more LED lighting elements may be formed, e.g. as a line in an x or y direction or as a matrix in both x and y directions.

The term "LED lighting element" here relates to any solid-state lighting element or element comprised of more than one such solid-state lighting elements. While this comprises LED lighting elements such as laser diodes and OLEDs, the presently preferred type of LED lighting element are light-emitting diodes comprising one or more doped semiconductor elements. An especially preferred type of LED lighting element including a luminescent color converter will be discussed in connection with preferred embodiments of the invention.

The carrier surface, on which the LED lighting elements are arranged, may be e.g. a circuit board for an electrical circuit. While the surface may be a plane surface, this is not a requirement.

According to the invention, at least the first LED lighting element comprises at least one spacer element. As will be further discussed below, both LED lighting elements may preferably have the same shape. Further, it is preferred to provide more than one spacer element on each LED lighting element. At least a portion of the spacer element projects into a side direction, i.e. at least substantially in parallel to the carrier surface. Thus, for the first and second LED lighting elements arranged next to each other on the carrier surface, the spacer element of the first LED lighting element extends towards the second LED lighting element.

The second LED lighting element is arranged in contact with the spacer element, such that it is aligned relative to the first LED lighting element, i.e. in a defined relative position thereto, such that the first and second LED lighting elements are arranged at a distance from each other, and that a gap is formed between the first and second LED lighting elements.

The spacer element is arranged to extend over the gap formed. It may be attached to the first LED lighting element. Thus, the space element mechanically connects the first and second LED lighting element over the gap, thus ensuring a defined arrangement and gap width. The spacer element may be made of any suitable material with at least some stability to keep the LED lighting elements at a distance at least during manufacturing of the lighting arrangement. Possible materials of the spacer element may include plastic, silicone, glass, or ceramic materials. The spacer element may be of opaque material to avoid optical cross talk. In some embodiments, the spacer element may be a separate body attached to the first LED lighting element, and may consist of a material different from the materials of the LED lighting element. In other embodiments, the spacer may be integrally formed with at least a part of the first LED lighting element. In particular, an optically active part of the first LED lighting element, i.e. a part which emits light, may comprise one or more spacer elements formed integrally therewith.

Providing an LED lighting element with a spacer element greatly facilitates the arrangement of the LED lighting elements in close proximity. While an exact relative arrangement and alignment of the LED lighting elements may also be achieved by very exact individual placing of the components, provision of at least one spacer element significantly facilitates to obtain high accuracy.

The distance, i.e. the width of the gap between the LED lighting elements obtained by the spacer element may be e.g. 1 mm or less, preferably less than 500 µm, particularly preferred 200 µm or less. A larger distance allows a better optical separation of adjacent LED lighting elements. The distance leads to a gap being formed between the LED lighting elements. A further improved separation may be achieved by arranging a separator material in between the LED lighting elements to reduce optical cross talk. The separator material may be opaque, e.g. optically absorbing or preferably have reflecting properties. The separator material may e.g. comprise a polymer, for example silicone, and further particles with desired optical properties.

In preferred embodiments, the first and second LED lighting elements may have at least one straight edge, particularly preferred is a rectangular shape. The LED lighting elements may e.g. have a size (measured in parallel to the carrier surface) of 200 µm to 3 mm, preferably 500-1500 µm, e.g. as edge length. The aligned arrangement of the first and second LED lighting elements may preferably refer to an arrangement in parallel, in particular with adjacent edges arranged at a small distance (gap width). Especially preferred are rectangular or square LED lighting elements arranged next to each other with parallel straight edges.

It is generally preferred to provide a relatively small spacer element. Contact between the spacer element and the second LED lighting element may lead to a certain amount of optical cross-talk, i.e. if the first LED lighting element is switched on and the second LED lighting element is switched off, there may still be a certain amount of light emitted from the area of the second LED lighting element due to optical coupling. In order to reduce optical cross-talk, the width of the portion of the spacer element which is in contact with the second LED lighting element is less than 20% of the width of the first LED lighting element. Further preferred is a width of the contacting portion of the spacer element of less than 10% of the width of the first LED lighting element, particularly preferred less than 5%. The width of the spacer element and of the first LED lighting element is preferably measured in parallel directions, e.g. in parallel to the edge of the first LED lighting element which is closest to the second LED lighting element.

Also in order to reduce optical cross-talk, the spacer element may have a tapered shape, i.e. such that its width decreases from e.g. a wider portion closer to an edge of the first LED lighting element to a narrow portion in contact with the second LED lighting element. Several different shapes are possible, such as e.g. (hemi-) spherical shape, pyramid shape, etc. For flat LED lighting elements with preferably parallel upper and lower surfaces, the shape of the spacer element is preferably also flat, e.g. with parallel upper and lower surfaces, and with e.g. a triangular, partly circular or trapezoid contour.

In preferred embodiments, the first and second LED elements may be electrically connected to an electrical circuit such that they can be independently operated. In particular, it is preferred that both the first and the second LED lighting element, as well as preferably further LED lighting elements, may be turned off or on independently of each of the other LED lighting elements. This is particularly preferred for matrix lighting applications, in particular for a vehicle headlamp using matrix lighting for ADB function.

In preferred embodiments, more than one spacer element is provided at the first LED lighting element (and preferably at further LED lighting elements). For example, two spacer elements may be provided projecting in at least substantially parallel direction, arranged at a distance from each other, e.g. projecting from the same edge. The second LED lighting element may be arranged in contact with both spacer elements, such that a parallel alignment may be easily achieved.

In particular for two-dimensional arrangement of LED lighting elements, such as for matrix arrangements, the first LED lighting element may be provided with spacer elements extending into different directions. In one embodiment, the LED lighting element may comprise at least a first and a second straight edge which are arranged at an angle, e.g. substantially at right angles to each other. A first spacer element may project from the first straight edge and a second spacer element may project from the second straight edge. Particularly preferably, at least two spacer elements extend from each of the two straight edges, thus facilitating a parallel aligned matrix configuration.

In one preferred embodiment, the lighting arrangement includes at least three LED lighting elements, i.e. a third LED lighting element besides the first and second LED lighting elements. The first LED lighting element comprises at least a first spacer element projecting into a first direction and a second spacer element projecting into a second direction, at least substantially at right angles to the first direction. The second LED lighting element is arranged spaced from the first element in the first direction and the third LED lighting element is arranged spaced from the first LED lighting element in the second direction. Both the second and third LED lighting elements are in contact with the respective spacer elements, such that an aligned position in both directions may be easily obtained.

According to a particularly preferred embodiment, the first LED lighting element, and preferably also the second LED lighting element as well as further LED lighting elements, may comprise a light emitting LED element and a luminescent color converter plate. The light emitting LED element may be e.g. a semiconductor die disposed to emit light of a predetermined wavelength range. The color converter plate converts the light to a different wavelength range. Preferably, the color converter plate may comprise a phosphor. Particularly preferred are converter plates made out of a ceramic material. In LED lighting elements with a color converter plate, the spacer elements may advantageously be formed integrally with the color converter plate.

A color converter plate may be arranged on top of a light emitting LED element. It is preferred to provide a color converter plate with a larger extension than the light emitting LED element at least in one direction parallel to the carrier surface. The converter plate may be arranged to form an overlap at least at one side of the LED lighting element.

In the vehicle headlight according to the invention, a lighting arrangement as described above is used in a headlight for a motor vehicle. In particular, a plurality of LED lighting elements may be arranged in matrix configuration for ADB functions.

In the manufacturing method according to the invention, the LED lighting elements are arranged on a carrier surface and aligned relative to each other by the at least one spacer element. In particular, the LED lighting elements may be soldered to the portions of the carrier surface, in particular to contacts on a circuit board. Alignment of the LED lighting elements may be achieved e.g. by reflow soldering, which in connection with one or more spacer elements may automatically provide alignment of the LED lighting elements.

These and other aspects of the invention will be apparent from and elucidated with reference to the embodiments described hereinafter.

DETAILED DESCRIPTION OF EMBODIMENTS

Figure 1:
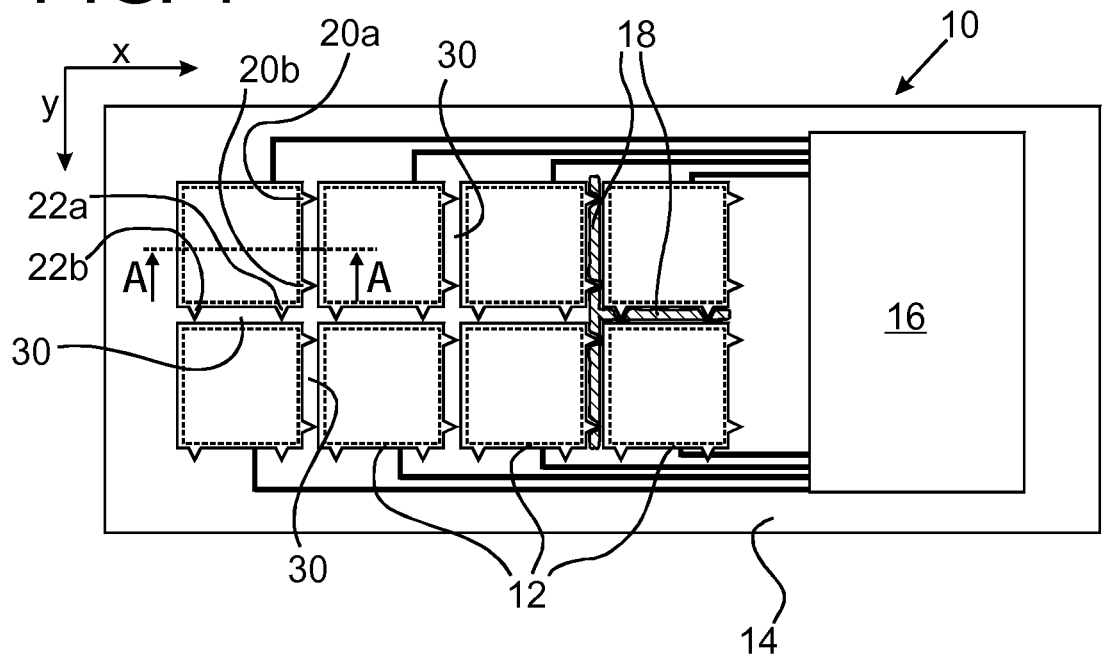
FIG. 1 shows a partly schematical top view of a lighting arrangement which may be used as a vehicle headlight.

FIG. 1 shows in a top view, partly schematically, a lighting arrangement 10 with, in the example shown, eight LEDs 12 arranged on a circuit board 14.

Figure 2:
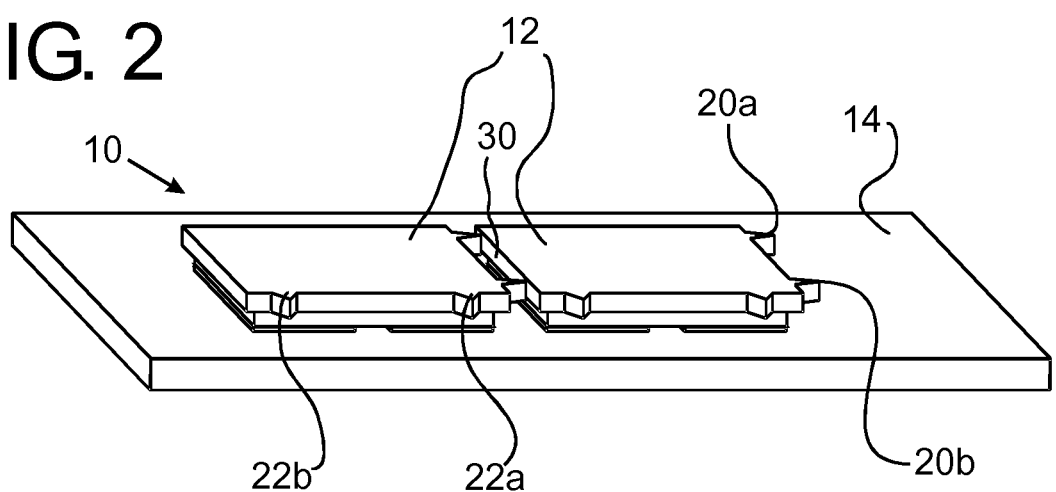
FIG. 2 shows a perspective view of a portion of the lighting arrangement of FIG. 1.

As visible from FIG. 1, FIG. 2, each LED 12 is of flat, plate-like shape with, in top view, a generally square contour.

The LEDs 12 are soldered to contact pads (not shown) on the circuit board 14. As schematically indicated in FIG. 1, the contact pads are connected by conductor tracks to a control circuit 16. The control circuit 16 supplies electrical operating power selectively to each of the eight LEDs 12 so that they are operated to emit light selectively and independently of one another.

As shown in FIG. 1, the LEDs 12 are arranged in a matrix configuration, which in the example shown comprises two rows and four columns. In a preferred use, the lighting arrangement 10 is used as a vehicle headlight for matrix lighting, which enables ADB (adapted driving beam) function by separately supplying operating power to individual LEDs 12, thereby selectively turning portions of the resulting emitted beam on or off.

In the matrix arrangement of FIG. 1, the LEDs 12 are arranged next to each other and aligned relative to each other. Formed between the LEDs 12 are narrow gaps 30.

In the example shown, the LEDs 12 may e.g. have a size of 700 μm×700 μm or 1 mm×1 mm. The edges of adjacent LEDs 12 are arranged in parallel at a short distance of e.g. 150-200 μm, i.e. the width of the gaps 30 may be e.g. 150-200 μm. In alternative embodiments, the LEDs 12 may have different sizes of e.g. 500 μm×500 μm, or of 400 μm×600 μm.

Relative arrangement of the LEDs 12 is achieved by spacers 20a, 20b, 22a, 22b extending across the gaps 30. Each LED 12 has a first set of spacers 20a, 20b extending in an x-direction and a second set of spacers 22a, 22b extending in an y-direction perpendicular thereto. The spacers 20a, 20b; 22a, 22b each extend from a straight edge of the square LED 12. The two spacers of each set are arranged distant from each other, spaced e.g. by 50-80% of an edge length.

Adjacent LEDs 12 are arranged such that their straight, adjacent edges contact the spacers 20a, 20b; 22a, 22b. Thus, the width of the gaps 30 and the parallel aligned orientation of the LEDs is ensured both in x-direction and in y-direction, leading to a well-defined matrix arrangement.

The gaps 30 formed between the LEDs 12 are filled with a separator filling 18 of a reflective material. In order to show the structure more clearly, the filling 18 is only shown for some of the LEDs in FIG. 1 and is not shown in FIGS. 2 and 3. However, as the skilled person will understand, the filling 18 is preferably provided in each gap 30 between the LEDs 12 to reduce optical cross-talk.

In the example of FIG. 1, FIG. 2, the spacers 20a, 20b, 22a, 22b each have a flat shape with a triangular contour as viewed from above. Due to the triangular contour, each spacer 20a, 20b, 22a, 22b has a wide portion adjacent to the edge of its LED 12, whereas the tip, which is contact with an adjacent LED 12, is narrow in comparison. Thus, the contact area between the spacers 20a, 20b, 22a, 22b and the adjacent LEDs 12 is very small.

For example, for an edge length of the LED 12 of 1 mm, the width of the wide portions of the triangular spacers may be e.g. 100 μm. Depending on how small the tip can be formed, the width thereof will only be a few μm. Due to the reduced contact area, an amount of optical cross-talk, i.e. light emitted from a first LED 12 and coupled into a second LED 12, is minimized.

Figure 4A:
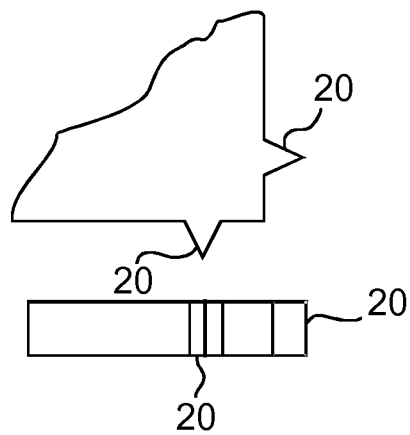
FIG. 4a-4e show top and side views of portions of different embodiments of spacers arranged at LED lighting elements.
Figure 4B:
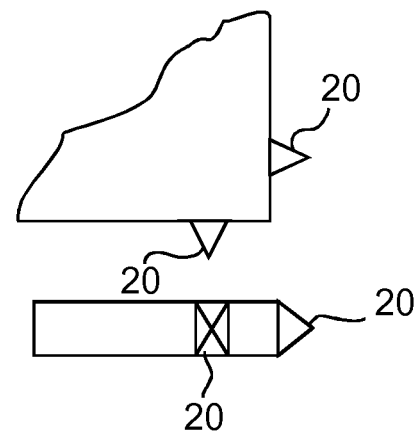
Figure 4C:
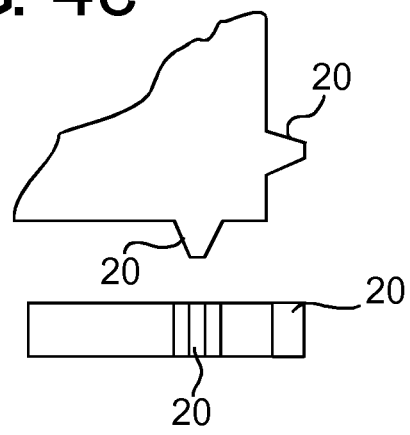
Figure 4D:
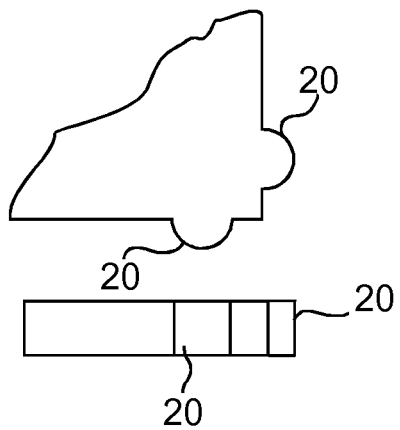
Figure 4E:
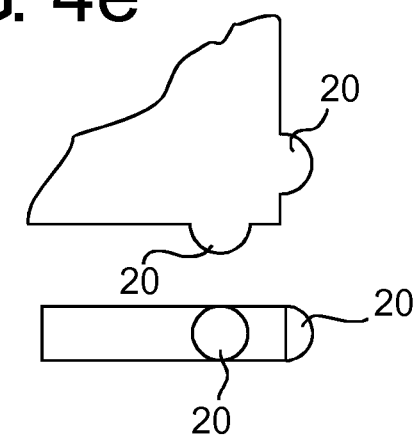

Different shapes for spacers 20 are possible, as shown in FIG. 4a-4e. For production purposes, flat shapes with tapering contour but constant thickness are preferred, such as shown in FIG. 4a for triangular contour, 4c for trapezoid contour and 4d for rounded (semicircular) contour. Alternative shapes such as pyramid shapes (FIG. 4b) or hemispherical shape (FIG. 4e) are also possible.

Figure 3:
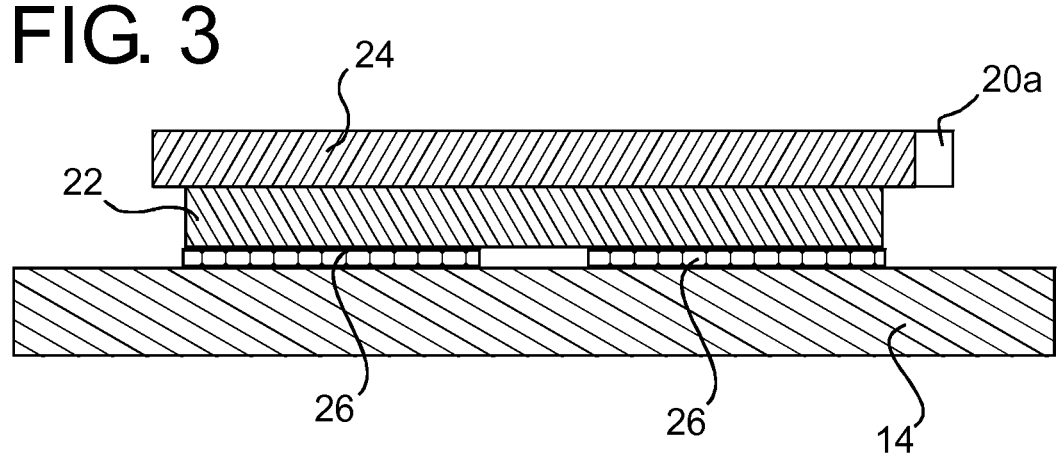
FIG. 3 shows a sectional view along A . . . A of an LED lighting element of the lighting arrangement of FIG. 1, FIG. 2.

In the preferred example, the LEDs 12 have a structure as shown in FIG. 3. A square, flat LED die plate 22 is covered by a ceramic color converter plate 24. The color converter plate 24 is larger than the LED die 22, thus forming an overlap of e.g. 30 μm along each edge. In alternative embodiments, the color converter plate 24 may be of the same size as the LED die 22, so that no overlap is formed. Depending on the choice of the relative dimensions of the LED die 22 and the color converter plate 24, an overlap of e.g. 0 μm to 50 μm may be formed.

The LED die 22 is mechanically and electrically connected to contact portions (not shown) of the circuit board 14 by solder pads 26. In operation, the LED die 12 emits light, e.g. of primarily blue color. The emitted light stimulates luminescence in the phosphor components of the color converter plate 24, such that white light is emitted.

The spacers 20a, 20b, 22a, 22b are integrally formed with the ceramic color converter plate 24. The lighting arrangement 10 may be manufactured by providing the circuit board 14 with contact portions for the LEDs 12. Solder material is applied to the contact portions, and the LEDs 12 are placed thereon. Through reflow soldering, the LEDs 12 are soldered to the contact portions, thereby automatically aligning through the spacers 20a, 20b, 22a, 22b. Following the solder process, the separator material 18 may be applied in the gaps between the LEDs 12. In the presently preferred embodiment, silicone with dispersed $TiO_2$ particles may be used to obtain a reflective barrier.

It should be noted that the above-mentioned embodiments illustrate rather than limit the invention, and that those skilled in the art will be able to design many alternative embodiments without departing from the scope of the claims.

The references to LED sizes with edge lengths of 400 μm to 700 μm are directed to examples only of LEDs available today. The concept of the invention applies to any size of LEDs. Also, the spacing of the LEDs may be chosen according to the desired application and may significantly differ from the values give in the examples.

While the above examples show spacers 20 formed integrally with a part of the LED, they may alternatively be provided as separate bodies e.g. of black or white plastic, silicone, glass, or ceramic, glued or otherwise fixed to the color converter plate or other parts of the LED.

While eight LEDs in a 2×4 matrix configuration are shown in the embodiment, the skilled person will understand that the concept of spacers applies to any number or arrangement of two or more LEDs, e.g. in a line, matrix or other configuration. While in the example shown, the spacers are provided integrally with a color converter plate, the concept of spacers may equally be applied with other types of LEDs, which may not include a color converter plate. Also, the shape and dimension of the LEDs 12 as well as the shape and dimensions of the spacers 20a, 20b, 22a, 22b may differ.

In the claims, any reference signs shall not be construed as limiting the claims. The word "comprising" does not exclude the presence of elements or steps other than those listed in the claims. The indefinite article "a" or "an" preceding an element does not exclude the presence of a plurality of such elements. The mere fact that certain measures are recited in mutually different dependent claims does not indicate that a combination of these measures cannot be used to advantage.

The invention claimed is:

1. A lighting arrangement, comprising:
   at least a first LED lighting element and a second LED lighting element arranged next to each other on a carrier surface, the first LED lighting element and the second LED lighting element being arranged at a distance forming a gap between the first LED lighting element and the second LED lighting element, wherein
   at least the first LED lighting element comprises at least one of a plurality of spacer elements projecting into a direction at least substantially in parallel to the carrier surface extending over the gap,
   the second LED lighting element being arranged in contact with at least one of the plurality of spacer elements such that the second LED lighting element is arranged aligned relative to the first LED lighting element, the at least one of the plurality of spacer elements having, at least in a portion thereof being in contact with the second LED lighting element, a width which is less than 20% of a width of the first LED lighting element, and
   the at least one of the plurality of spacer elements are formed integrally with an optically active part of the first LED lighting element, the optically active part emitting light during operation of the first LED lighting element.

2. The lighting arrangement according to claim 1, wherein at least one of the plurality of spacer elements has a tapered shape such that a width thereof decreases up to a portion thereof being in contact with the second LED lighting element.

3. The lighting arrangement according to claim 1, wherein the first LED lighting element and the second LED lighting elements are electrically connected to an electrical circuit such that they can be independently operated.

4. The lighting arrangement according to claim 1, wherein the first LED lighting element comprises at least two of the plurality of spacer elements projecting into at least substantially parallel directions, the at least two of the plurality of spacer elements being arranged at a distance from each other, and
   the second LED lighting element is arranged in contact with the at least two of the plurality of spacer elements.

5. The lighting arrangement according to claim 1, wherein
   at least the first LED lighting element comprises at least one straight edge, and
   the at least one spacer element of the at least one first LED lighting element projecting at least substantially perpendicularly from the straight edge.

6. The lighting arrangement according to claim 5, wherein
   the first LED lighting element comprises at least a first straight edge and a second straight edge, the first straight edge and the second straight edges being arranged at least substantially at right angles to each other, and
   wherein at least a first spacer element of the plurality of spacer elements projects from the first straight edge, and at least one second spacer element of the plurality of spacer elements projects from the second straight edge.

7. The lighting arrangement according to claim 1, wherein
   the first LED lighting element comprises at least a first spacer element of the plurality of spacer elements projecting into a first direction at least substantially in parallel to the carrier surface, and a second spacer element of the plurality of spacer elements projecting into a second direction at least substantially in parallel to the said carrier surface, the first direction and the second direction being arranged at least substantially at right angles to each other,
   wherein the second LED lighting element is arranged spaced from the first LED lighting element in the first direction and in contact with the at least a first spacer element of the plurality of spacer elements, and
   wherein a third LED lighting element is arranged spaced from the first LED lighting element in the second direction and in contact with the second spacer element of the plurality of spacer elements.

8. The lighting arrangement according to claim 1, wherein a plurality of LED lighting elements of identical shape comprising at least the first LED lighting element and the second LED lighting element are arranged next to each other on the carrier surface.

9. The lighting arrangement according to claim 1, wherein the first LED lighting element comprises a light emitting LED element and the optically active part is a luminescent color converter plate.

10. The lighting arrangement according to claim 9, wherein
    the plurality of spacer elements are formed integrally with the color converter plate.

11. The lighting arrangement according to claim 9, wherein
    the color converter plate is arranged on top of the light emitting LED element,
    wherein the color converter plate has a larger extension in at least one direction at least substantially parallel to the carrier surface, and
    the color converter plate being arranged to form an overlap over the LED lighting element.

12. The lighting arrangement according to claim 1, wherein
    at least one of a reflective and opaque material is provided between the first LED lighting element and the second LED lighting elements.

13. A vehicle headlight, comprising:
a lighting arrangement including
at least a first LED lighting element and a second LED lighting element arranged next to each other on a carrier surface, the first LED lighting element and the second LED lighting element being arranged at a distance forming a gap between the first LED lighting element and the second LED lighting element, wherein
at least the first LED lighting element comprises at least one of a plurality of spacer elements projecting into a direction at least substantially in parallel to the carrier surface extending over the gap,
the second LED lighting element being arranged in contact with at least one of the plurality of spacer elements such that the second LED lighting element is arranged aligned relative to the first LED lighting element, the at least one of the plurality of spacer elements having, at least in a portion thereof being in contact with the second LED lighting element, a width which is less than 20% of a width of the first LED lighting element, and
the at least one of the plurality of spacer elements are formed integrally with an optically active part of the first LED lighting element, the optically active part emitting light during operation of the first LED lighting element.

14. Method A method of manufacturing a lighting arrangement, comprising the steps of
arranging a first LED lighting element on a carrier surfaced, the first LED lighting element comprising at least one of a plurality of spacer elements projecting into a direction at least substantially in parallel to the carrier surface, the at least one of a plurality of spacer elements having, at least in a portion thereof being in contact with a second LED lighting element, a width which is less than 20% of a width of the first LED lighting element,
arranging at least the second LED lighting element on the carrier surface next to the first LED lighting element to be in contact with the at least one of the plurality of spacer elements, such that the second LED lighting element is arranged aligned relative to the first LED lighting element, and such that the first LED lighting element and the second LED lighting elements are arranged at a distance forming a gap between the first LED lighting elements and second LED lighting elements and that the spacer element extends over the gap,
wherein the at least one of the plurality of spacer elements are formed integrally with an optically active part of the first LED lighting element, the optically active part emitting light during Operation of the first LED lighting element.

* * * * *